(12) United States Patent
Kamath et al.

(10) Patent No.: US 7,026,217 B1
(45) Date of Patent: Apr. 11, 2006

(54) METHOD OF FORMING AN ANTIFUSE ON A SEMICONDUCTOR SUBSTRATE USING WET OXIDATION OF A NITRIDED SUBSTRATE

(75) Inventors: Arvind Kamath, Mountain View, CA (US); Venkatesh P. Gopinath, Fremont, CA (US); Wen-Chin Yeh, Fremont, CA (US); David Pachura, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 50 days.

(21) Appl. No.: 10/697,446

(22) Filed: Oct. 29, 2003

(51) Int. Cl.
*H01L 21/336* (2006.01)
(52) U.S. Cl. ...................... 438/281; 438/600
(58) Field of Classification Search ........... 438/131, 438/132, 467, 600, 601, 281; 257/50, 529, 257/530; 365/96
See application file for complete search history.

(56) References Cited

U.S. PATENT DOCUMENTS

| | | | | |
|---|---|---|---|---|
| 4,757,359 A | * | 7/1988 | Chiao et al. ................... 257/37 |
| 5,330,920 A | * | 7/1994 | Soleimani et al. .......... 438/703 |
| 5,610,084 A | * | 3/1997 | Solo de Zaldivar ......... 438/600 |
| 5,763,922 A | * | 6/1998 | Chau .......................... 257/371 |
| 2004/0004269 A1 | * | 1/2004 | Fifield et al. ............... 257/530 |
| 2004/0051162 A1 | * | 3/2004 | Chidambarrao et al. .... 257/530 |

* cited by examiner

*Primary Examiner*—Stephen W. Smoot
(74) *Attorney, Agent, or Firm*—Beyer Weaver Thomas

(57) ABSTRACT

A method of producing an antifuse includes introducing nitrogen by ion implantation means into the substrate. An oxide dielectric layer is then formed on the nitrided substrate in a wet oxidation ambient. The conditions of the ion implantation and the oxidation are controlled to generate a dielectric with uniform thickness and a low breakdown voltage when subjected to a high electric field.

10 Claims, 10 Drawing Sheets

METHOD OF FORMING AN ANTIFUSE ON A SEMICONDUCTOR SUBSTRATE USING WET OXIDATION OF A NITRIDED SUBSTRATE

BACKGROUND OF THE INVENTION

1. Field of the Invention

The present invention relates to processes involved in the manufacturing of semiconductor devices on a substrate. More particularly, the present invention relates to new methods for forming antifuses on semiconductor wafers.

2. Description of the Related Art

Integrated circuit devices are commonly designed with redundant components such that a redundant component may be substituted for a defective component discovered during testing. For example, portions of a defective memory array may be repaired by substituting a redundant memory array for the defective one. Using this method, the yield or acceptable rate of chips produced on a wafer may be increased.

Conventional DRAM and SRAM memories often use laser fuse blowing techniques, i.e., blowing one or more fuses with a laser beam to deactivate a defective cell or line. The unblown fuse has a low resistance whereas the blown fuse has a high resistance, typically functioning as an open circuit. But laser techniques are expensive and time consuming. Moreover, the laser energy can damage adjacent areas.

To address these issues, antifuse technology has been introduced. Antifuses typically functionally present an open circuit when unblown, having relatively high resistances (e.g., several mega ohms or more) and relatively low resistances (usually less than 1000 ohms) when blown. Both the fuses and the antifuses may be used to provide one-time programming capability to a circuit.

Antifuses are formed by one of several conventional methods using doped polysilicon layers. For example, according to a first conventional method, an oxide layer is positioned between a first doped polysilicon or metal layer and a second doped polysilicon or metal layer. Typically these antifuse layers are approximately 100 Angstroms thick and require a high voltage to breakdown. For example, such antifuse devices are often located in FPGA's and require an applied electrical voltage of between 10 and 20 volts to activate the antifuse element. Activation in the antifuse context refers to the step of implementing the redundant circuit.

According to a second conventional method, an antifuse element is formed in a doped polysilicon layer, the application of a high (i.e., well above nominal design voltage) converting the high resistivity polysilicon link to a low resistivity type.

Another conventional method places a thin (i.e., 15–25 Angstrom) silicon oxide dielectric layer between conductive electrodes. Charge pumps are used to step up the circuit voltage to about 8 to 10 volts. However, the thin oxide layer often has a very high rate of leakage. Moreover, a large part of the area of the die is consumed by the charge pump.

As described, each of the conventional methods for forming antifuses has certain drawbacks which affect their suitability for semiconductor applications. For each of them, special design considerations, such as including additional circuitry affect the design process, the size of the die, and special requirements such as additional power supply voltages. Accordingly, what is needed is a new method for forming an antifuse that can be easily incorporated into CMOS process flow. That is, not too thick or thin a dielectric layer and a low enough activation voltage to eliminate the charge pump.

SUMMARY OF THE INVENTION

To achieve the foregoing, the present invention provides methods for forming antifuses in a conventional CMOS process flow. By incorporating one additional implant step, an antifuse is created which has more desirable breakdown voltage characteristics as compared to conventional antifuses.

In accordance with one embodiment of the present invention, an antifuse is created with a customized oxide thickness. The method of forming an antifuse on a semiconductor substrate includes providing a partially fabricated semiconductor device. Nitrogen is implanted into a first portion of the substrate of the partially fabricated semiconductor device in a region unprotected by a photoresist mask. A dielectric oxide layer is grown on the nitrogen implanted substrate using a wet oxidation process. A gate material is deposited directly on the oxide layer, wherein the gate material comprises one terminal of the antifuse.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

FIGS. 1A–1F illustrate the stages in formation of an antifuse in accordance with one embodiment of the present invention. Initially, a sacrificial oxide layer 104 is formed on the silicon substrate 102 in accordance with conventional process steps to protect the substrate from implantation damage. The sacrificial oxide layer may be of a conventional thickness, for example 50 to 300 Angstroms. Conventional methods include, for example, thermal growth or chemical vapor deposition processes. Active regions of the substrate are shown separated by isolation areas 103, formed by methods well known to those of skill in the relevant arts.

Figure 1A:
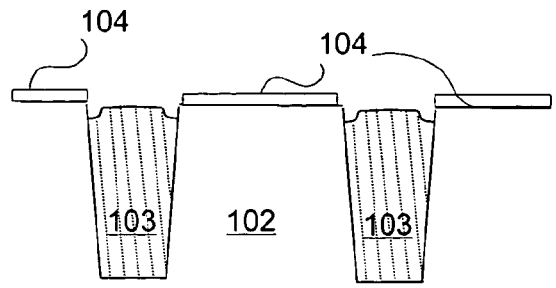
FIGS. 1A–1F illustrate the stages in formation of an antifuse in accordance with one embodiment of the present invention.
Figure 1B:
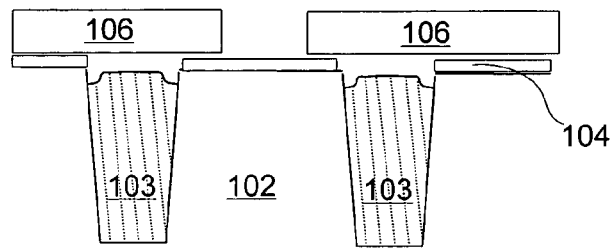

Next, as illustrated in FIG. 1B, a resist layer is formed on the partially fabricated wafer stack and patterned and etched to form a mask 106, preferably using conventional photolithography steps, to form open areas to receive a nitrogen implant of the desired dose. That is, the photoresist mask is formed on the wafer stack to expose the anitfuse areas and to protect the remaining portions of the partially fabricated wafer stack from the implant. Standard processing steps may be used to form wells and diffusion areas (not shown) at appropriate locations on the substrate.

Figure 1C:
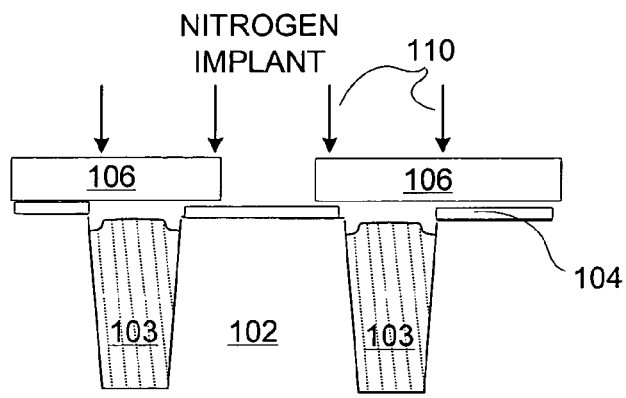

As illustrated in FIG. 1C, nitrogen 110 is implanted into the substrate. Preferably, the nitrogen implant comprises the normal isotope of nitrogen (N14) and the implant dose falls within the range of about $5 \times 10^{13}$ atoms/cm$^2$ to $1 \times 10^{15}$ atoms/cm$^2$ of nitrogen at an energy preferably in the range from about 5 to 50 Kev. More preferably, the nitrogen implant dose is about $4 \times 10^{14}$ atoms/cm$^2$ implanted at an energy of about 25 Kev. The nitrogen is implanted through conventional methods such as are well known to those of skill in the relevant art. In accordance with one embodiment, the nitrogen is preferably implanted within 200–600 Angstroms of the interface between the sacrificial oxide and the substrate. The depth of the nitrogen implant is dependant upon the implantation energy and sacrificial oxide thickness. Following implantation, the resist is removed by conventional process steps, for example, by ashing and stripping. Next, preferably, a pre gate oxidation wet clean is performed, again according to conventional techniques.

Figure 1D:
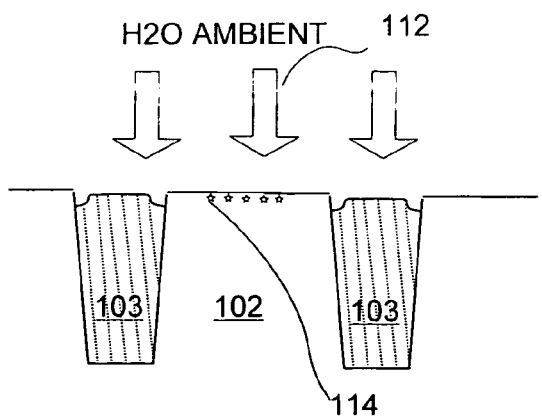

Next, as illustrated in FIG. 1D, a gate or sacrificial oxide is formed in a wet ambient 112. That is, the ambient is preferably provided with a uniform and controllable quantity of steam. Growth of the gate dielectric on a nitrogen implanted surface in a controllable wet ambient (i.e., wet or steam oxidation) creates insulating elements and atomic bonds that exhibit an enhanced and highly uniform rate of electrical wearout at lower voltages or times in comparison to gate dielectrics grown in dry or dry with HCl ambients to the same thickness. FIG. 1D illustrates the wet ambient 112 in the process of forming the oxide over the implanted nitrogen 114 formed in the silicon substrate 102.

Figure 1E:
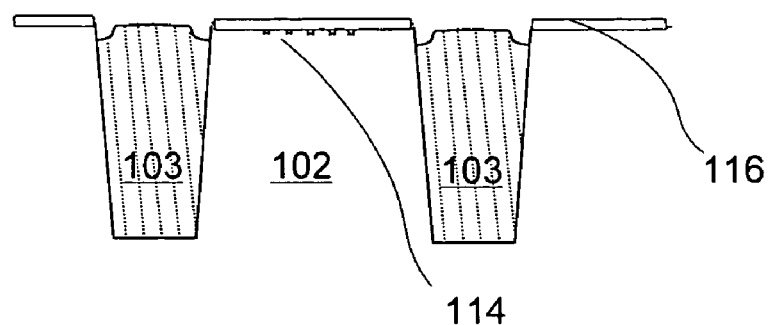

The oxide is preferably grown at temperatures in the range from 750 to 1000 degrees C., more preferably from 800 to 900 degrees C. Beyond this range the process is not readily controllable. Suitable ambient temperatures may be provided by any suitable means as known to those of skill in the art, for example, including horizontal, vertical or rapid thermal furnaces. FIG. 1E illustrates the dielectric oxide layer 116 formed in the wet ambient. Under identical conditions, wet oxidation results in a higher growth rate than dry oxidation. That is, without wishing to be bound by any theory, it is believed that at high temperatures, $H_2O$ dissociates into H and OH. The OH radicals diffuse faster in $SiO_2$ than $O_2$. Moreover, at the higher temperatures, the chemical reaction rate between oxygen (from the OH radicals) and silicon is higher.

By varying the conditions of ion implantation, for example the dose and energy, in combination with a wet oxidation ambient, the resulting final thickness of the oxide layer (i.e., the dielectric) can be engineered to produce a dielectric with high uniformity in thickness and low breakdown voltage when subjected to high electric fields. Preferably, the oxide dielectric 116 will have a thickness in the range of 30 to 40 Angstroms, more preferably about 35 Angstroms. The optimal thickness of the oxide dielectric 116 is dependant upon the distribution of $N_2$ in the oxide and the desired operating voltage. For example, while a thin oxide in the 30 to 40 Angstrom range is suitable for operating voltages of 1.8 V, an oxide dielectric thickness of 40 to 60 Angstroms is more suitable for higher operating voltages, such as at 2.5 volts.

Figure 1F:
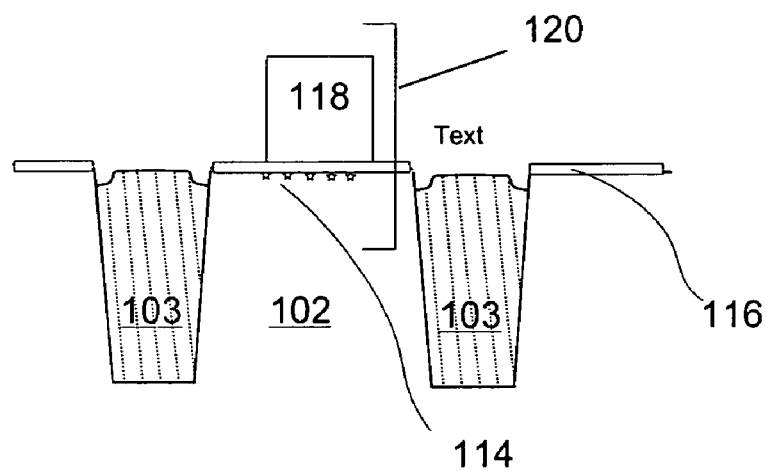

Next, as illustrated in FIG. 1F, gate material is deposited and patterned and etched to form gate 118 in accordance with conventional CMOS process steps. For example, the gate may comprise polysilicon. Gate 118 serves as one terminal of the antifuse 120, an initially "open" link between the gate 118 and the substrate 102 converted to a conducting link to ground with the application of a suitably high voltage. That is, the present invention in one embodiment provides an antifuse, capable of detection by evaluating the effect of gate leakage on the gate node voltage. Further details as to the circuit implementation and detecting techniques are described below and illustrated with reference to FIG. 6.

In an alternative embodiment, the present invention may be combined with nitrogen implantation schemes for creating gates of multiple thicknesses in semiconductor devices. That is, after implanting the nitrogen into the antifuse region and in the regions underlying the transistor gates, an integrated circuit having gate oxides of one or more thicknesses is formed in conjunction with the antifuse. The overall steps in the process in accordance with one embodiment are illustrated in FIGS. 2A–2E.

In one embodiment, gate oxides are grown by first implanting a first portion of the semiconductor substrate with a first dose of an oxide growth retardant, for example nitrogen, implanting a second portion of the semiconductor substrate with a second dose of an oxide growth retardant for the formation of an antifuse, and lastly oxidizing the semiconductor substrate in a first wet environment to grow a first oxide on the first portion and a second oxide on the second portion. Usually, a third portion of the semiconductor substrate is not implanted with any oxide growth retardant so that a third oxide is grown on the third portion during the common wet oxidation step. The third oxide is the thickest of the three. Thus, the method of forming an antifuse by nitriding the substrate may be incorporated into the multiple gate process flow.

Figure 2A:
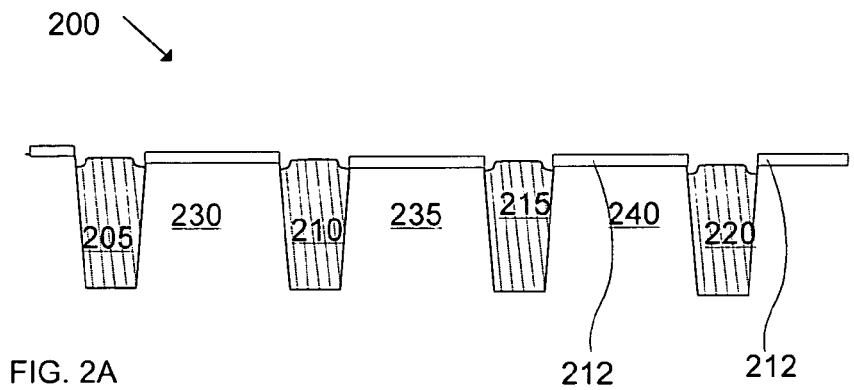
FIGS. 2A–2E illustrate the stages in formation of an antifuse and multiple gate oxides in accordance with an alternative embodiment of the present invention.

FIG. 2A is a cross-sectional view of an exemplary partially fabricated wafer 200 in which four filled isolation trenches 205, 210, 215, and 220 define three different islands (or active areas) 230, 235, and 240 where different technology node transistors operating at different operating voltages (Vdd) can be formed. In area 235, an antifuse is formed in accordance with the steps described in FIGS. 1A–1C, the antifuse region preferably oxidized in a wet environment at the same time as the oxide layers for the transistors in regions 230 and 240.

Each transistor formed in areas of 230 and 240 can potentially represent a device of a different generational node. That is, because of the different operating voltage (Vdd), each island of 230 and 240 requires a different gate oxide thickness. For example, the highest Vdd transistor built in 240 requires about 62 Å of oxide, whereas the low Vdd transistor in 230 requires about 50 Å of oxide.

It will be appreciated by those skilled in the art that although the exemplary wafer 200 is shown with three thicknesses of gate oxides, the particular requirements of the final product will dictate how many different thicknesses of gate oxides are required. Additionally, although many applications will require gate oxides that correspond to generational nodes, other applications may require half-nodes or other non-standard oxide thicknesses.

Figure 2B:
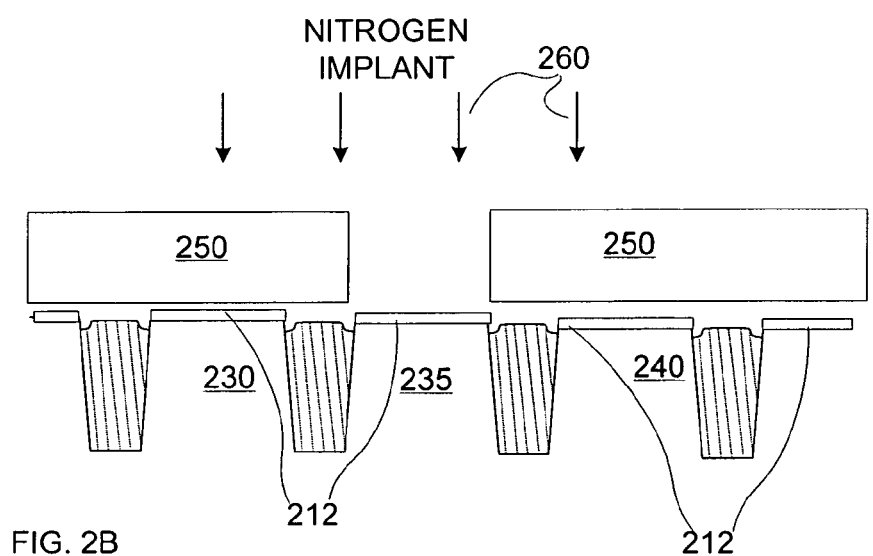

Initially, as illustrated in FIG. 2B, a photo resist layer is deposited and patterned to form mask 250. The mask is designed to expose only the low thickness gate-oxide antifuse area 235 on the semiconductor substrate. The low thickness gate oxide antifuse region 235 is then implanted with a high dose of an oxide growth retardant, for example a nitrogen implant 260. FIG. 2B is a cross sectional view of the exemplary wafer 200 during high dose implantation. The mask 250 covers the thickest oxide area 240 and the low voltage transistor region 230, exposing only the antifuse gate oxide area 235 so that nitrogen 260 will only be implanted in area 235.

The nitrogen implant for the antifuse is performed in accordance with the techniques described in FIGS. 1A–1E. That is, preferably, the nitrogen implant comprises the normal isotope of nitrogen (N14) and the implant dose falls within the range of about $5 \times 10^{13}$ atoms/cm$^2$ to $1 \times 10^{15}$ atoms/cm$^2$ of nitrogen at an energy preferably in the range from about 5 to 50 Kev. More preferably, the nitrogen implant dose is about $4 \times 10^{14}$ atoms/cm$^2$ implanted at an energy of about 25 Kev. The nitrogen is implanted through conventional methods such as are well known to those of skill in the relevant art. By varying the conditions of ion implantation, for example the dose and energy, in combination with a wet oxidation ambient, the resulting final thickness of the oxide layer (i.e., the dielectric) can be engineered to produce a dielectric with high uniformity in thickness and low breakdown voltage when subjected to high electric fields. Preferably, the oxide dielectric for the antifuse in region 235 will have a thickness in the range of 30 to 40 Angstroms, more preferably about 34 to 35 Angstroms. The optimal thickness of the oxide dielectric is dependant upon the distribution of $N_2$ in the oxide and the desired operating voltage.

Referring back to FIG. 2B, after implantation the mask is removed. The removal can be accomplished with standard resist strip processes. For example, either a wet or dry etch clean can be used, as appropriate.

Figure 2C:
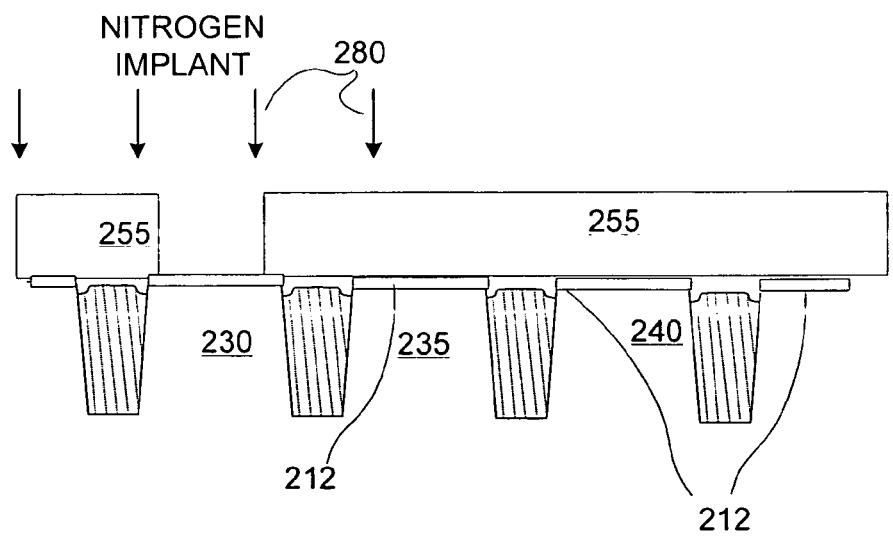

Next, as illustrated in FIG. 2C, a photo resist layer is deposited and patterned to form mask 255. The mask is designed to expose only the low thickness gate-oxide area 230 on the semiconductor substrate. The low thickness gate oxide region 230 is then implanted with an appropriate dose of an oxide growth retardant, for example a small dose of nitrogen 280. The mask 255 exposes only the thin gate oxide area 230 so that the correct dose of nitrogen 280 will only be implanted in that the area 230. After implantation the mask is removed in accordance with the techniques described above. The dosage of nitrogen required in this and the following steps varies with the final gate oxide thicknesses required for the transistors. By controlling dosage and exposure times in accordance with techniques known to those of skill in the art, the nitrogen implants can be used to grow gate oxides of various thicknesses in a single oxidation step.

Figure 2D:
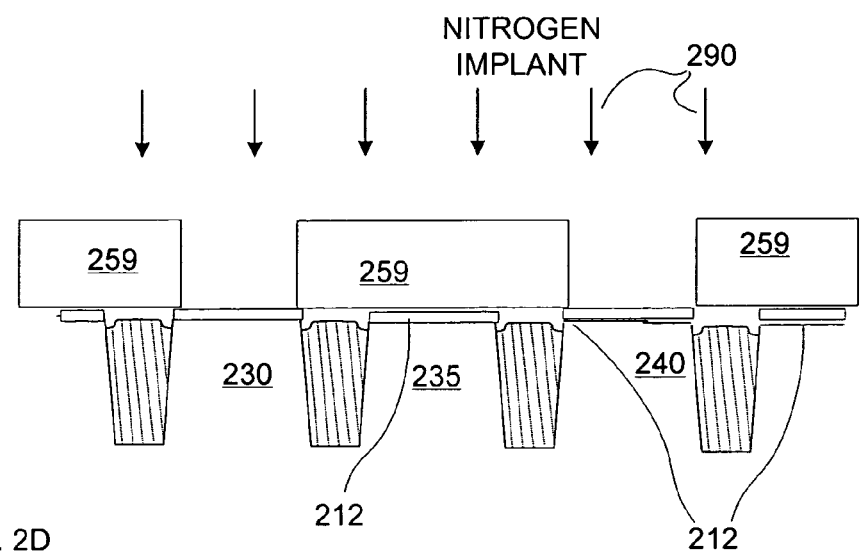

Next, as illustrated in FIG. 2D, a photo resist layer is deposited and patterned to form mask 259. The mask is designed to expose the high thickness gate-oxide area 240 on the semiconductor substrate as well as the low thickness gate-oxide area in region 230. The high thickness gate oxide region 240 and the low thickness region 230 is then implanted with an appropriate dose of an oxide growth retardant, for example a dose of nitrogen 290. The mask 259 exposes the thick gate oxide area 240 so that the correct dose of nitrogen 290 will be implanted in the area 240 and a supplemental implant of nitrogen will occur to the already nitrided region 230. These steps could be repeated as many times as necessary for different thicknesses of oxides. It should be noted that in an alternative embodiment, the exemplary wafer 200 of FIGS. 2A–2D, the thickest gate oxide area 240 is not implanted with any oxidation retardant. In yet another alternative embodiment, masking is performed so that only one region at a time is exposed. That is, according to this alternative embodiment, rather than accumulating nitrogen implants in a specific region in two or more implant steps or exposures, each region is unmasked only once and the amount of implanted nitrogen in that specific region determined only from a single implant step.

Once all the areas that require an oxide growth retardant are implanted, the sacrificial oxide is stripped. For example, a hydrofluoric acid clean, followed by an RCA clean, followed by a hydrofluoric clean would be appropriate. It is to be noted that it is preferred to keep the sacrificial oxide as thin as possible as a protection layer for masking and implant steps.

Figure 2E:
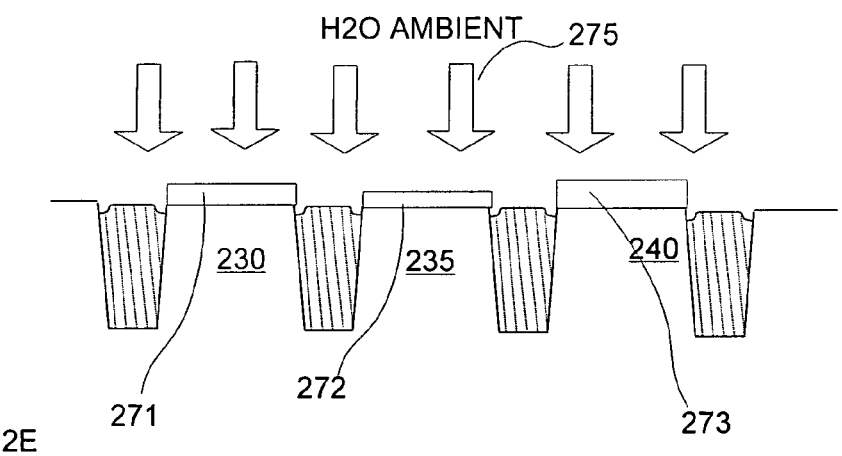

The oxides are then grown in a wet ambient 275 as illustrated in FIG. 2E. The conditions of growth are those previously contemplated when the oxide growth implantation steps were performed. That is, the ambient is preferably provided with a uniform and controllable quantity of steam. Growth of the gate dielectric on a nitrogen implanted surface in a controllable wet ambient (i.e., wet or steam oxidation) creates insulating elements and atomic bonds that exhibit an enhanced and highly uniform rate of electrical wearout at lower voltages or times in comparison to gate dielectrics grown in dry or dry with HCl ambients to the same thickness. The oxide is preferably grown at temperatures in the range from 750 to 1000 degrees C., more preferably from 800 to 900 degrees C. Suitable ambient temperatures may be provided by any suitable means as known to those of skill in the art, for example, including horizontal, vertical or rapid thermal furnaces.

FIG. 2E is a cross sectional view of the exemplary wafer 200 showing the oxide growth during wet oxidation. During growth, the implanted areas naturally grow thinner due to the retarding effect of the nitrogen on oxidation. FIG. 2E is a cross sectional view of the exemplary wafer 200 with its final oxide growths 271, 272, and 273. That is, a thinner gate oxide 271 is grown in the low voltage transistor area 230 whereas a thicker gate oxide 273 is grown in the high voltage transistor area 240. As discussed above in reference to FIGS. 1A–1D, the gate oxide layer 272 for the antifuse preferably has a thickness in the range of 30–40 Angstroms. More preferably, gate oxide 272 for the transistor functioning as the antifuse in region 235 has a thickness of about 34 to 35 Angstroms. The thicknesses of the oxides 271 and 273 in the regions 230 and 240 are dependant upon the desired operating voltages and the nitrogen implant procedure is preferably adjusted to achieve those oxide thicknesses in accordance with methods known to those of skill in the relevant arts. Thus, further description as to nitrogen implant ranges and corresponding gate oxide thicknesses formed in the wet oxidation steps are deemed unnecessary here.

Figure 3A:
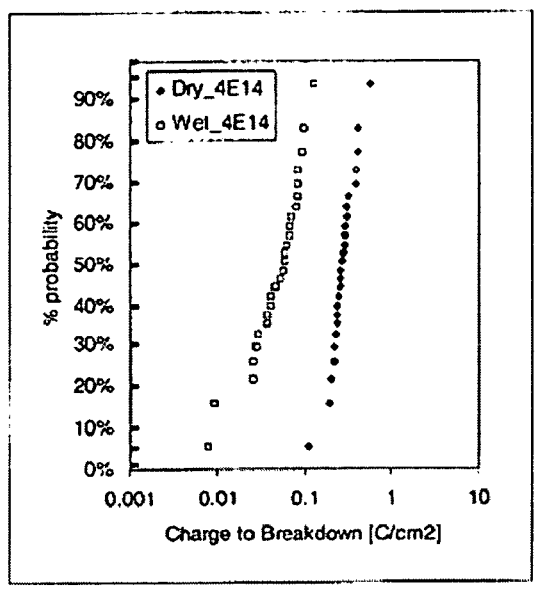
FIGS. 3A–3B are plots illustrating charge-to-breakdown for large area capacitors grown in nitrogen implanted substrates using wet and dry oxidation.
Figure 3B:
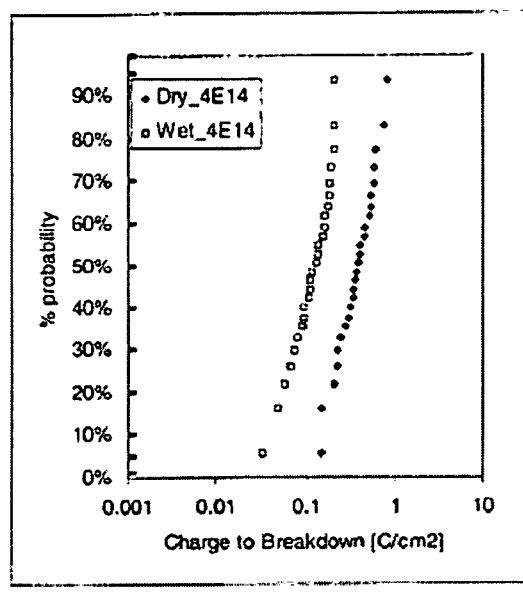

FIGS. 3A–3B are plots illustrating cumulative charge-to-breakdown for large area capacitors grown in nitrogen implanted substrates using wet and dry oxidation. Charge-to-breakdown ("QBD") is a method used to determine the reliability of thin gate oxides in MOS devices. Typically, voltage is applied to the MOS structure to force a controlled amount of charge to breach the dielectric. As illustrated in FIG. 3A, the N channel Charge-to-Breakdown values are shown for large area capacitors grown in $4\times10^{14}/cm^2$ nitrogen implanted surface using alternatively wet and dry oxidation. As shown, the devices characterized consistently resulted in a lower QBD for wet oxidation as compared to dry oxidation. The oxide thickness for the samples was about 34 Angstroms. This same relationship held for the P channel charge-to-breakdown illustrated in FIG. 3B. Thus, as shown, the charge to breakdown for the oxide formed by wet oxidation techniques is significantly reduced (i.e., about $\frac{1}{10}$th) in comparison to than that required for oxides formed by dry oxidation techniques. This enables dielectrics formed by the techniques of the present invention to convert from "open" links to conducting links at smaller applied voltages than typical antifuses in the same time or conversely in a smaller time at the same voltage. Preferably, the breakdown or programming voltage is 5 volts or less at a very short programming time, although the invention is not so limited.

Figure 4:
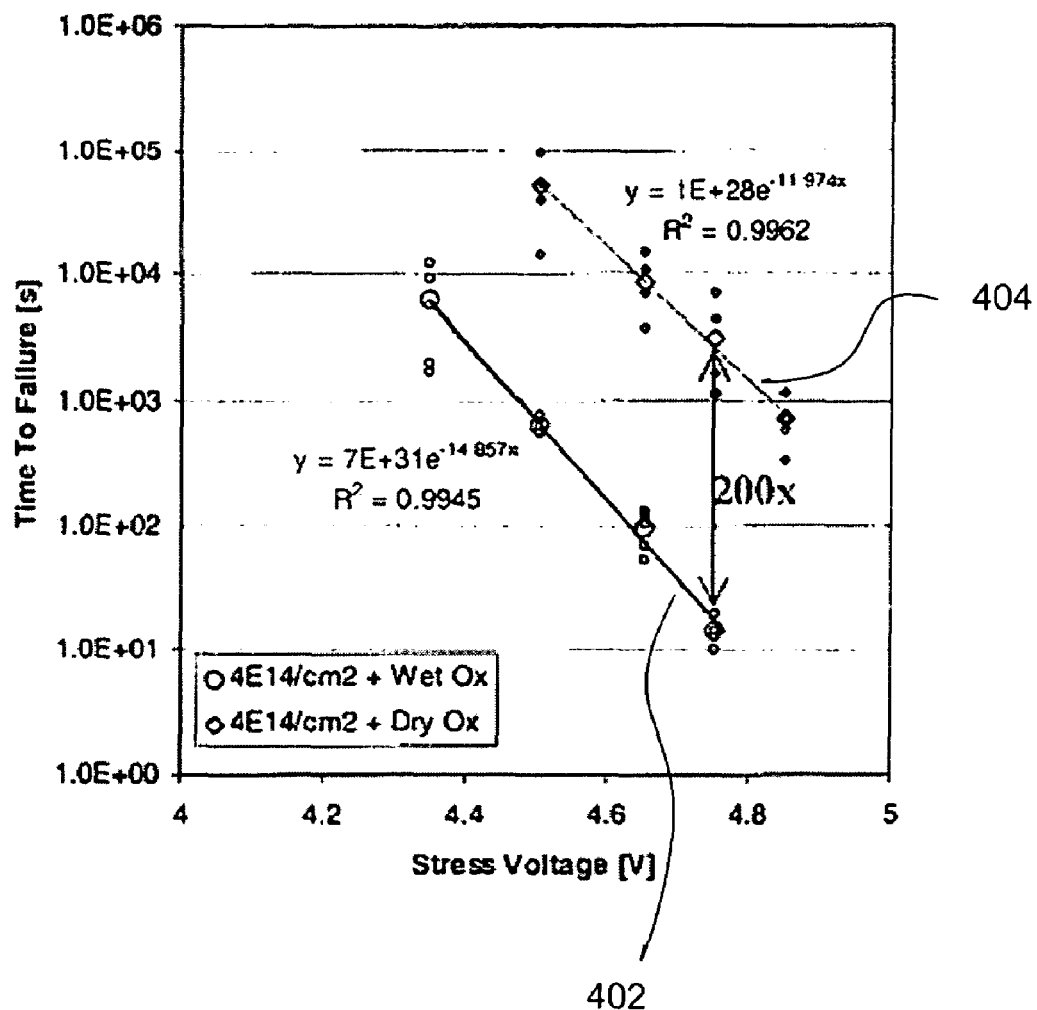
FIG. 4 is a plot illustrating time-to-failure under different stress conditions on nitrogen implanted surfaces.

The antifuses produced by the techniques of the present invention also result in lower programming times. FIG. 4 is a plot illustrating time-to-failure under different stress conditions on a nitrogen implanted surface. Time-to-failure is also known as time dependent dielectric breakdown (TDDB) and is the time needed to break down an oxide stressed at a given electric field. The oxides (wet and dry) were grown on a surface implanted with nitrogen at a dose of $4\times10^{14}/cm^2$. The time to failure for the dry oxide 404 is about 200 times the time to failure for the wet oxide 402. For example, at an applied stress voltage of 4.75 V, the wet oxide breaks down in a period under 15 seconds as compared to about 3000 seconds for the dry oxide. The operation of the dielectric is not compromised at low voltages. That is, under low voltage operating conditions (e.g 1–1.8V), these nitrided oxides still possess adequate lifetimes. For example, the data presented in FIG. 4 may be extrapolated to indicate that the low field breakdown voltage easily exceeds the 10-year operating lifetime requirement.

Figure 5A:
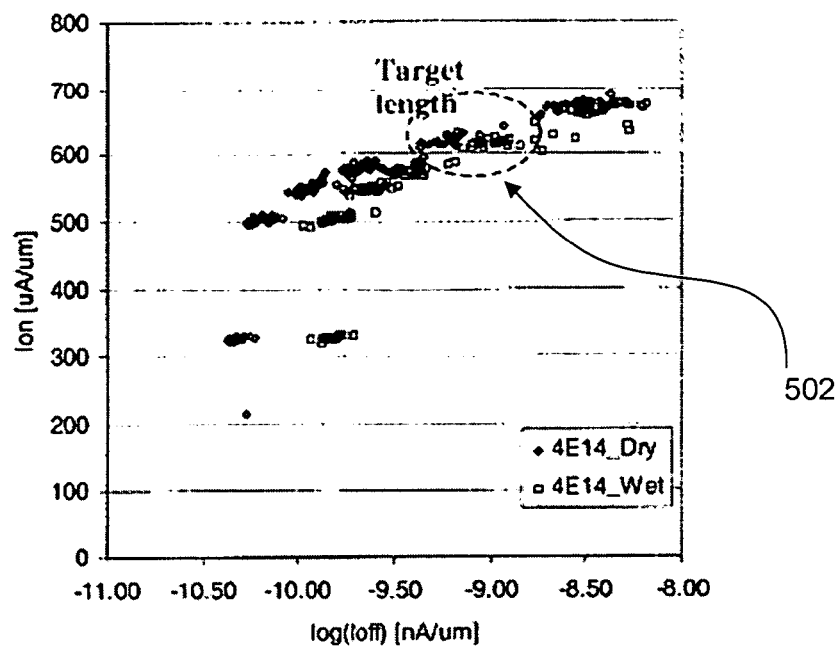
FIGS. 5A–5B are plots illustrating current behavior for N and P channel transistors in accordance with one embodiment of the present invention.
Figure 5B:
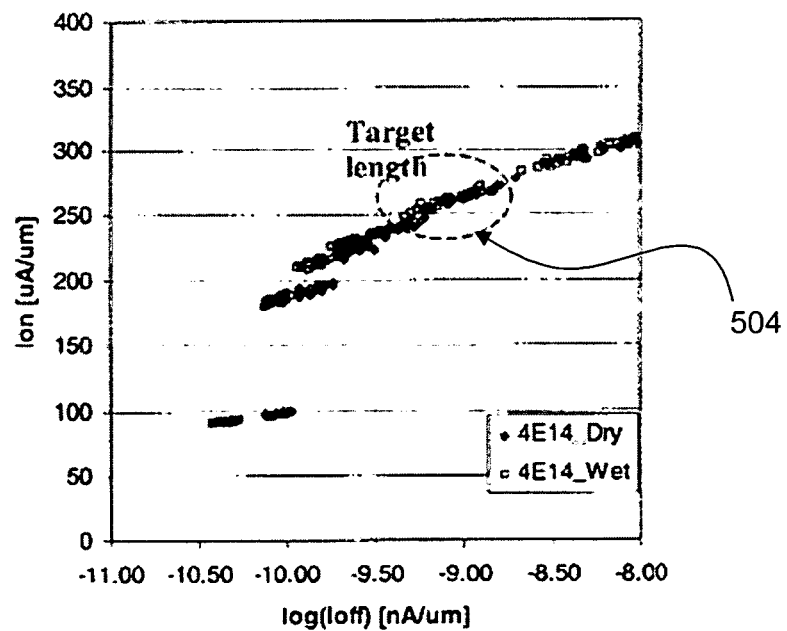

The performance of the transistor at normal operating conditions is not compromised either. FIGS. 5A–5B are plots illustrating current behavior of devices produced by wet oxidation in comparison to conventional devices produces by dry oxidation. FIGS. 5A–5B illustrates the Ion-Ioff behavior for N and P channel transistors having gate oxides produced by either wet or dry oxidation steps. As shown, the drive currents for the wet and dry processes in the target length region 502 are comparable for the N channel transistors as are the respective drive currents in the target length region 504 for the P channel transistors shown in FIG. 5B.

Figure 7:
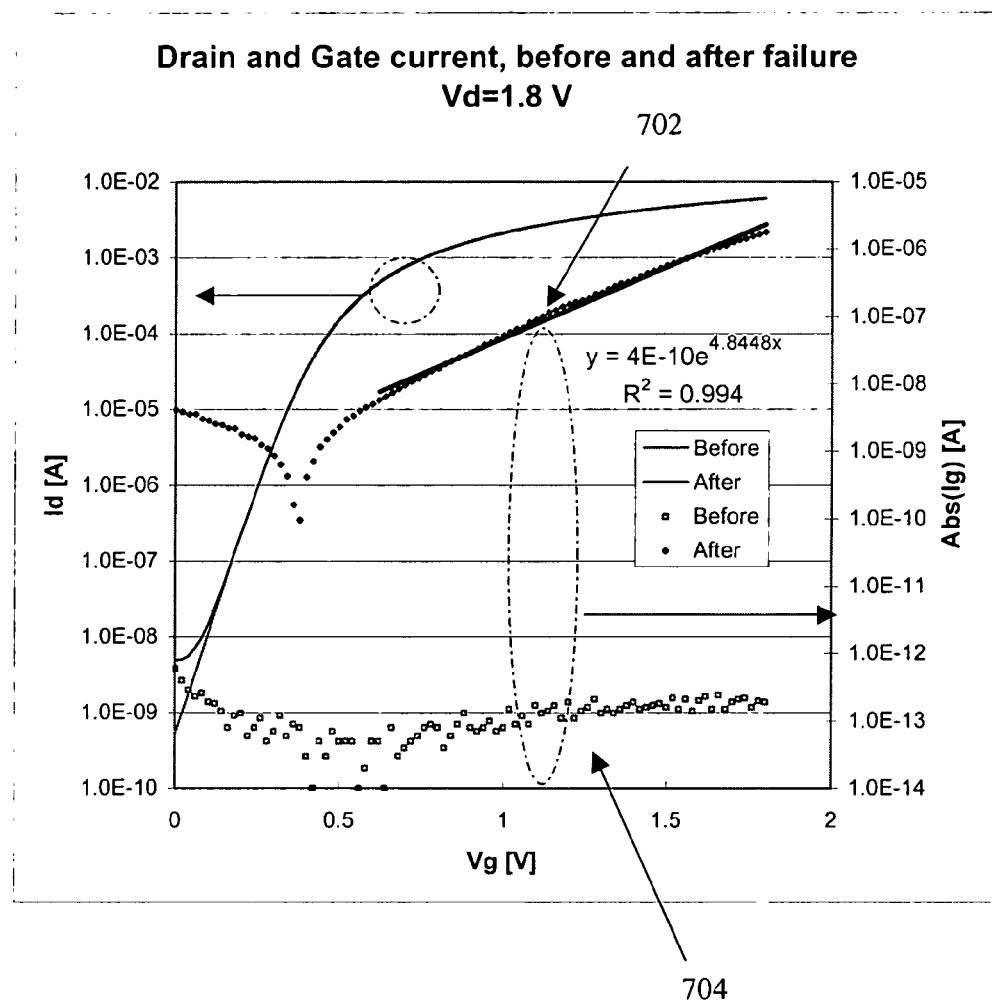
FIG. 7 illustrates a sample behavior of the drain and gate current of a transistor formed in accordance with embodiments of the present invention

Controlling the gate oxide breakdown behavior of a FET transistor to implement antifuse functions requires special consideration. While not wishing to be bound by any theory, it is believed that after gate oxide breakdown the channel in the transistor continues to provide current. That is, the gate breaks down in one spot, but the undamaged gate areas continue to control the channel effectively. FIG. 7 illustrates a sample behavior of the drain and gate current of a transistor formed in accordance with embodiments of the present invention. Specifically, the Id/Vg and Ig/Vg behavior of a 11/0.18 NMOS transistor before and after gate oxide breakdown is illustrated. As shown by the drain current plots before and after oxide breakdown in the transistor, the device continues to perform well in spite of a substantial increase in gate leakage. Drain to Source conductance is still well controlled by the device.

Figure 6:
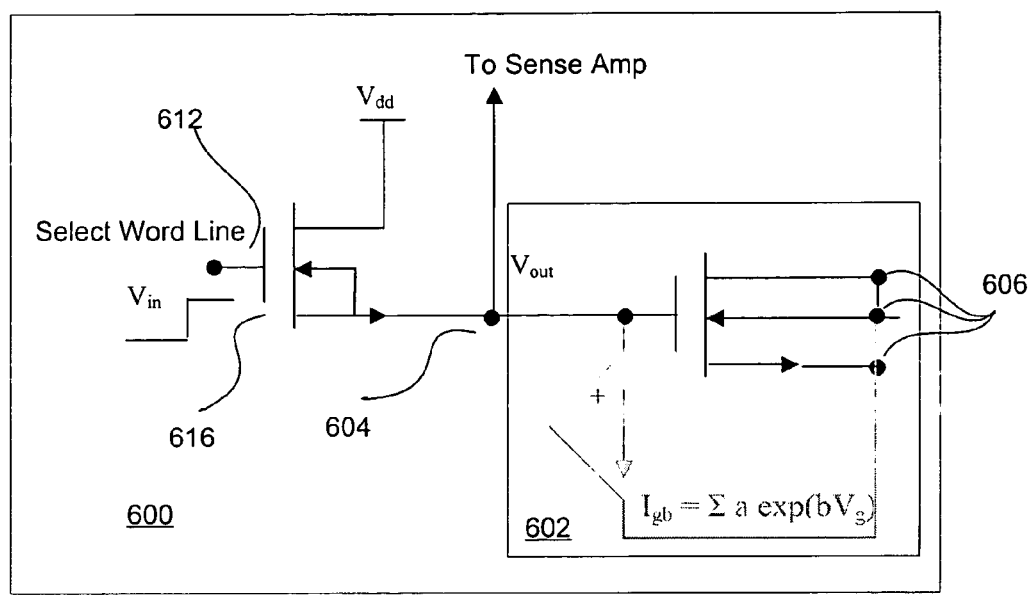
FIG. 6 is a circuit implementation of an antifuse in accordance with one embodiment of the present invention.

Thus, in lieu of sensing a change in the drain to source conduction, the present invention in one embodiment uses the increase in gate leakage of the device as a signal. FIG. 6 is a circuit implementation of an antifuse sensing circuit in accordance with one embodiment of the present invention.

Figure 8:
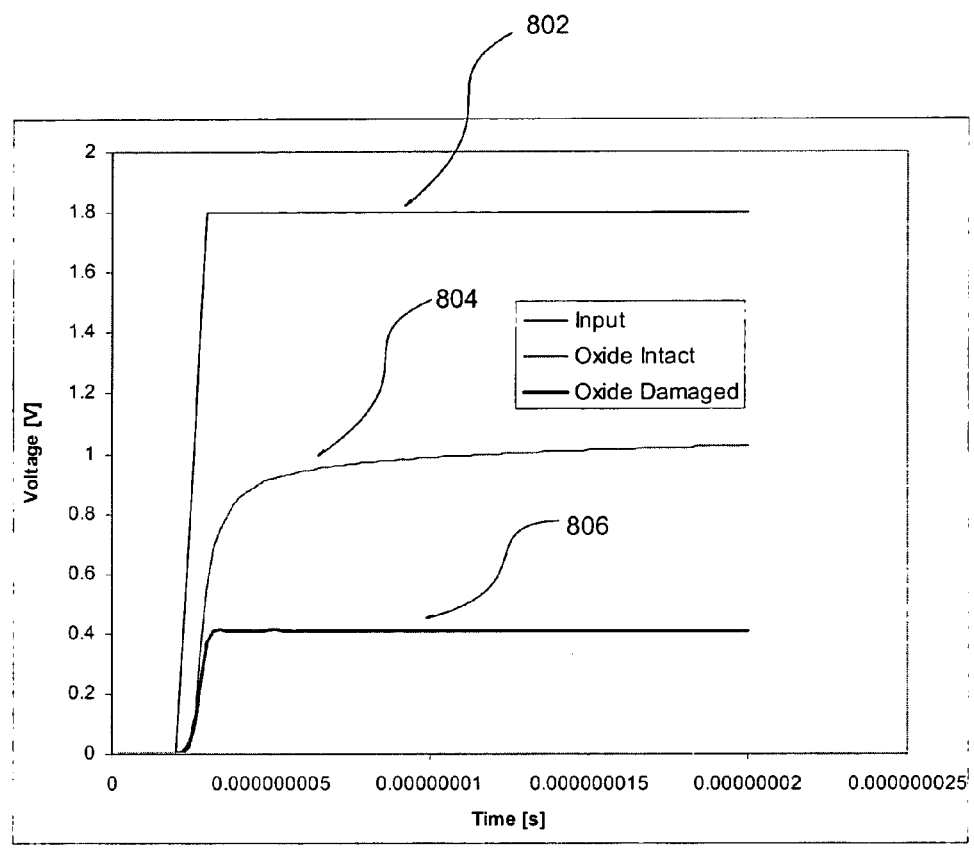
FIG. 8 illustrates a sample behavior of the voltage at the gate node of an antifuse formed in accordance with embodiments of the present invention.

The programmed state of the device was implemented in HSPICE as a simple Voltage-Controlled-Current-Source (VCCS) whose current is modeled by the exponential curve fit to gate leakage shown in FIG. 8.

The antifuse 602 is formed by implanting nitrogen and growing an oxide in a wet ambient as described above with reference to FIGS. 1A–1F and 2A–2E. In other words, the antifuse 602 comprises a transistor that has a relatively low charge to breakdown when subjected to a high electrical field. FIG. 6 illustrates the antifuse 602 configured in a read or detection circuit 600. As known to those of skill in the relevant art, a separate "writing" or programming circuit is used to program the antifuse. In this case, programming involves increasing the gate oxide leakage of the antifuse 602 by applying a high voltage to the terminals, the high voltage damaging the gate oxide and causing the significant increase in gate leakage.

The antifuse 602 includes a first node, i.e., the gate node 604, connected to a sense amp gate (not shown) to determine the state of the antifuse, i.e., whether it is in a "0" state (unprogrammed) or a "1" (programmed) state. The antifuse 602 includes drain, source, and substrate regions 606 which are all grounded. Access is provided by the select transistor 616. The select device 616 is used to access the antifuse whose drain, source and substrate are all grounded. That is, when an input voltage (representing a digital "1") is applied to the gate 612 (i.e., the select word line) the select transistor 616 is turned "on" to supply a voltage (VDD) to the antifuse gate node 604. When the antifuse is unprogrammed (i.e., erased or undamaged) the gate oxide leakage in the antifuse 602 is minimal, for example on the order of $1.0\times10^{-4}$ nA, such as illustrated as reference point 704 in FIG. 7. That is, when the access word line 612 sees a signal, during the unprogrammed or erased state the antifuse device 602 does not conduct any gate current, or at least negligible amounts. This allows the gate node 604 to rise to a high voltage value.

In contrast, when the antifuse 602 is programmed, the gate leakage in the antifuse 602 is significantly greater. For example, as illustrated in FIG. 7, the gate leakage current 702 at a gate voltage of approximately 1.0 volt is approximately $1.0\times10^2$ nA. The gate leakage current allows a high current connection to the antifuse 602 ground terminals 606, and thereby pulls the node 604 down to a low voltage value. Proper selection of the antifuse device length and widths can be used to maximize the difference in these two voltages for fast sensing. Since the same set of access and sensing devices will be in the path during the "programming" phase, it is advisable to use thicker oxide devices (such as for the select transistor 616 and the sense amplifier) for additional margin (over the 200× lifetime difference).

FIG. 8 illustrates a sample behavior of the voltage at the gate node of an antifuse formed in accordance with embodiments of the present invention under "programmed" and "erased" conditions. FIG. 8 shows the results of a simulation when the access word line sees a signal. That is, when the access word line 612 sees an input signal 802, the antifuse gate node 604 reaches a higher voltage 804 during erased conditions (when the gate oxide is intact) than the voltage 806 reached when the device is programmed (the oxide is damaged). Thus, according to one embodiment, the antifuse detection circuit is configured with a gate node of the antifuse connected to a higher voltage node.

By implementing these techniques into the CMOS flow, antifuse elements may be created having highly uniform and controllable rates of wearout at lower voltages, and/or times in comparison to gate dielectrics grown by dry oxidation processes or dry with HCl oxidation processes. The controllable low rate of wearout enables its use in a chip as a low voltage antifuse, thereby eliminating the need for boosting voltages by charge pumps or alternatively reducing the number of charge pump stages.

Thus, lower programming voltages or times may be achieved without compromising the device lifetime at the operating voltages. For example, breakdown times at programming voltages of 5 V are less than 1 second compared to lifetimes of greater than 1000 years at the operating voltage of at the operating voltage of 1.8V. This antifuse technology provides further advantages over laser blowing techniques. For example, unlike laser blown fuse technology, the proposed scheme can be brought within the die thereby reducing die size. Moreover, the antifuses may be placed adjacent to the memory array provided that the programming voltages can be routed to the antifuse area. Thus, routing restrictions for metals within the repair bank are eliminated. The antifuses formed by the method of the present invention may also be used as one-time field programmable elements in additional applications.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming an antifuse on a semiconductor substrate, the method comprising:
   providing a partially formed semiconductor device having a substrate;
   implanting nitrogen into a first portion of the substrate of an unmasked portion of the partially formed semiconductor device;
   implanting a second portion of the substrate with nitrogen;
   using a wet oxidation process to simultaneously grow a first dielectric oxide layer on the nitrided first portion of the substrate and to grow a second dielectric oxide layer on the nitrided second portion of the substrate wherein the thickness of the first dielectric oxide layer is different than the thickness of the second dielectric oxide layer; and
   depositing a gate material directly on the dielectric oxide layer, wherein the gate material comprises one terminal of the antifuse.

2. The method of forming an antifuse as recited in claim 1, wherein the nitrogen is implanted using a dose in the range from about $5 \times 10^{13}$ atoms/cm$^2$ to $1 \times 10^{15}$ atoms/cm$^2$ of nitrogen.

3. The method of forming an antifuse as recited in claim 1, wherein the nitrogen is implanted using an energy in the range from about 5 to 50 Kev.

4. The method of forming an antifuse as recited in claim 1, wherein the nitrogen implant dose is about $4 \times 10^{14}$ atoms/cm$^2$ implanted at an energy in the range of about 5 keV to about 50 keV.

5. The method of forming an antifuse as recited in claim 1, wherein the wet oxidation process takes place at a temperature in the range from 800 to 900 degrees C.

6. The method of forming an antifuse as recited in claim 1, wherein a sacrificial oxide layer is first grown on the substrate and the nitrogen is implanted within 200–600 Angstroms of the interface between the sacrificial oxide and the substrate.

7. The method of forming an antifuse as recited in claim 1, wherein the thickness of at least one of the grown dielectric oxide layers is in the range from 30 to 40 Angstroms.

8. The method of forming an antifuse as recited in claim 1, wherein thickness of at least one of the grown dielectric oxide layers is in the range from 40 to 60 Angstroms.

9. The method of forming an antifuse as recited in claim 1, wherein the dose of the nitrogen in the second portion is different than the dose in the first portion.

10. A method of forming an antifuse on a semiconductor substrate, the method comprising:
   providing semiconductor substrate having a plurality of shallow isolation trenches that define active regions between the trenches;
   selectively implanting nitrogen into a first active region of the substrate;
   exposing the nitrogen implanted active region to an oxidizing ambient consisting of water thereby growing an oxide layer on the nitrogen implanted active region;
   forming a gate directly on the oxide layer, wherein the gate comprises one terminal of the antifuse device; and
   selectively implanting nitrogen into a second active region of the substrate and exposing the nitrogen implanted second active region to the oxidizing ambient at the same time as the oxide layer to form a second oxide layer having a thickness different than the oxide layer.

* * * * *